United States Patent
Ramappa

(10) Patent No.: US 7,443,189 B2
(45) Date of Patent: Oct. 28, 2008

(54) METHOD TO DETECT AND PREDICT METAL SILICIDE DEFECTS IN A MICROELECTRONIC DEVICE DURING THE MANUFACTURE OF AN INTEGRATED CIRCUIT

(75) Inventor: Deepak A. Ramappa, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 224 days.

(21) Appl. No.: 11/049,109

(22) Filed: Feb. 2, 2005

(65) Prior Publication Data

US 2006/0172443 A1 Aug. 3, 2006

(51) Int. Cl.
 *G01R 31/06* (2006.01)
(52) U.S. Cl. ............................ 324/765; 324/751
(58) Field of Classification Search ......... 324/750–753, 324/765–769; 382/141–145; 250/492.2
See application file for complete search history.

(56) References Cited

U.S. PATENT DOCUMENTS 5,799,104 A * 8/1998 Nakamura et al. .......... 382/144
6,232,787 B1 * 5/2001 Lo et al. ..................... 324/751
6,252,412 B1 * 6/2001 Talbot et al. ................ 324/750

OTHER PUBLICATIONS

Jenkins et al. "Analysis of Silicide Process Defects by Non-contact Electron Beam Charging",30th Annual Proceedings Reliability Physics 1992,IEEE Catalog No. 92CH3084-1;pp. 304-308.*

* cited by examiner

*Primary Examiner*—Vinh P Nguyen
(74) *Attorney, Agent, or Firm*—Wade J. Brady, III; Frederick J. Telecky, Jr.

(57) ABSTRACT

The present teachings provide methods for detection of metal silicide defects in a microelectronic device. In an exemplary embodiment, a portion of a semiconductor substrate may be positioned in a field of view of an inspection tool. The method also includes producing (120) a voltage contrast image of the portion, wherein the image is obtained using a collection field that is stronger than an incident field. The method also includes using (130) the voltage contrast image to determine a metal silicide defect in a microelectronic device. Other embodiments include an inspection system (200) for detecting metal silicide defects and a method of manufacturing an integrated circuit (300).

9 Claims, 5 Drawing Sheets

METHOD TO DETECT AND PREDICT METAL SILICIDE DEFECTS IN A MICROELECTRONIC DEVICE DURING THE MANUFACTURE OF AN INTEGRATED CIRCUIT

TECHNICAL FIELD OF THE INVENTION

The present invention is directed, in general, to a method and system for detecting metal silicide defects in microelectronic devices during the manufacture of integrated circuits.

BACKGROUND OF THE INVENTION

Metal silicides are commonly used as contact materials for active areas of microelectronic devices, such as transistors having source and drain regions and gate regions. Unfortunately, a number of problems have been encountered when manufacturing devices having metal silicide electrodes. In some cases, unacceptable numbers of nonfunctional transistors are constructed because of the presence of a gross short circuit caused by silicide defects. In other instances, silicide defects from the source and drain regions punch through the source/drain junction into the semiconductor substrate, resulting in a large leakage current. In still other cases, there is a large diode leakage between the source and drain regions and the semiconductor substrate. These problems contribute to the production of unacceptably low yields of transistors that operate within performance specifications.

Traditional methods and instruments to detect metal silicide defects have typically been performed on a completed microelectronic device, that is, after completing all front-end-of-line (FEOL) and back-end-of-line (BEOL) processes, as part of quality assurance monitoring. Examples of conventional detection methods include assessing the electrical or logic performance characteristics of the device by measuring leakage current or bit failure rates, or inspecting scanning electron microscopic images of the device. The recent introduction of electron-beam passive voltage contrast detection methodology and instrumentation has greatly facilitated the measurement of sub-surface metal silicide defects earlier in the manufacturing process.

Importantly, improvements in voltage contrast imaging have reduced the time to measure silicide shorts, thereby allowed such imaging as part of FEOL processes. The metal silicide defects detected by this approach, however, are limited to gross shorts manifesting, for example, as metal silicide pipes in semiconductor devices. There is a continuing need to improve on the detection of metal silicide defects in the FEOL process in order to further reduce resource expenditure on the fabrication of devices that are destined to be defective.

Accordingly, what is needed in the art is a method and system for detecting silicide defects and potential defects in a microelectronic device during the manufacture of an integrated circuit that does not suffer from the limitations associated with conventional approaches to defect detection.

SUMMARY OF THE INVENTION

To address the above-discussed deficiencies of the prior art, the present invention provides in one embodiment, a method of detecting metal silicide defects in a microelectronic device. The method comprises positioning a portion of a semiconductor substrate in a field of view of an inspection tool. The method also comprises producing a voltage contrast image of the portion, wherein the voltage contrast image is obtained using a collection field that is stronger than an incident field. The method also comprises using the voltage contrast image to determine a metal silicide defect in the microelectronic device.

Another aspect of the present invention is an inspection system for detecting metal silicide defects in a microelectronic device. The inspection system comprises an inspection tool comprising an electron-beam source and a collection optical unit. The inspection system further comprises a stage configured to position a portion of a semiconductor substrate in a field of view of the inspection tool. The inspection system also comprises a controller. The controller is configured to adjust an electron-beam landing energy applied by the electron-beam source to the semiconductor substrate and thereby produce an incident field on a surface of the semiconductor substrate. The controller is also configured to adjust a detection potential applied to the collection optical unit to thereby produce a collection field that is stronger than the incident field. The controller is further configured to produce a voltage contrast image of the portion of the semiconductor substrate, and use the voltage contrast image to determine a metal silicide defect in a microelectronic device.

Still another aspect of the present invention is a method of manufacturing an integrated circuit. The method comprises forming a microelectronic device on a semiconductor substrate and forming metal silicide electrodes for the microelectronic device. The microelectronic device is inspected for metal silicide defects using the method described above.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiments as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

The present invention benefits from the realization that previous approaches using passive voltage contrast imaging to detect silicide defects are inadequate because they do not predict additional silicide defects that can form after FEOL processing. Metal silicide defects are formed due to the diffusion of metal ions from metal silicide electrodes into channels in the lattice structure of the semiconductor substrate, thereby introducing structural defects in the semiconductor substrate. Defect formation is enhanced by both FEOL and BEOL thermal processing because increased temperatures promote metal ion diffusion.

As part of the present invention, it was recognized that there could be silicide defects that are too small to form a short after FEOL thermal processing and therefore go undetected using conventional approaches. In some process flows, however, a considerable number of these small silicide defects can go on to develop into shorts after BEOL thermal processing.

The small silicide defects go undetected because existing methods and tools for detecting defects require the existence of an actual short circuit in the microelectronic device being inspected. Conventional methods and tools rely on a large number of secondary electrons being emitted from a grounded structure in the microelectronic device as compared to an analogous neighboring microelectronic device with an ungrounded or floating structure. The presence of a grounded structure, however, implies that a short is present in the microelectronic device to create the ground. If there is no short, such as the case where there is small silicide defect, then there is insufficient voltage contrast to detect the defect using conventional methods and systems for voltage contrast imaging.

The present invention overcomes this limitation by providing a method and system to detect both metal silicide defects that form actual shorts after FEOL processing, as well as metal silicide defects that will only form shorts, or cause high leakage currents, after BEOL processing. The ability to accurately predict potential metal silicide defects advantageously allows accelerated learning and correction of problematic manufacturing flow processes, thereby reducing resource expenditure on the fabrication of devices that are destined to be defective.

The present invention is particularly advantageous for detecting nickel silicide electrode induced defects. It should be understood, however, that the scope of the present invention includes detecting such defects in any microelectronic device caused by the formation of an electrode comprising any transition metal silicide. For the purposes of the present invention, a transition metal is defined as any element in Periods 4-6 and Groups 3-12 of the Periodic Table of Elements (International Union of Pure and Applied Chemist Convention for designating Groups and Periods), as well as alloys thereof.

Figure 1:
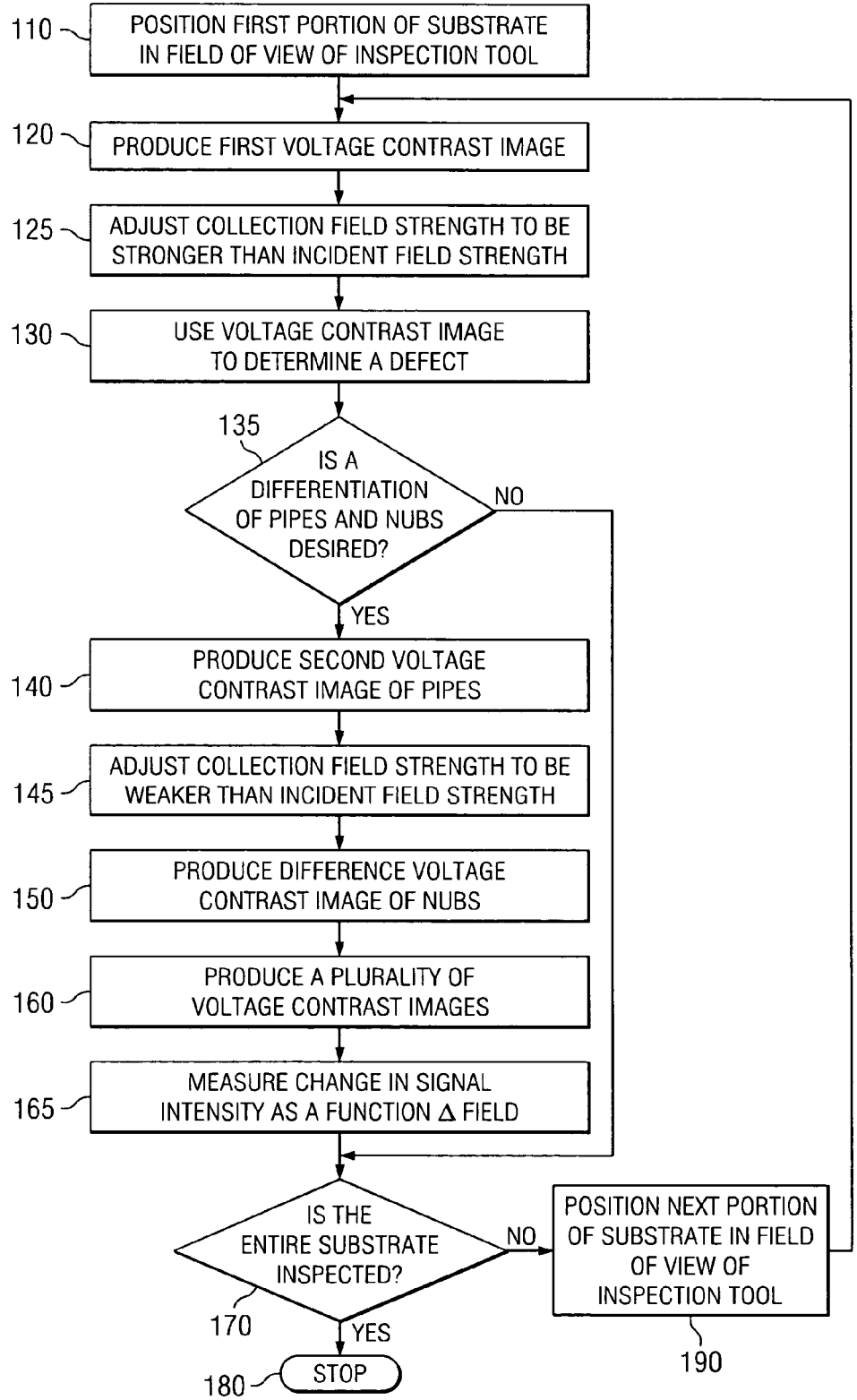
FIG. 1 illustrates by flow diagram, selected steps in an exemplary method of detecting metal silicide defects in a microelectronic device according to the principles of the present invention.

One embodiment of the present invention is a method of detecting metal silicide defects in a microelectronic device. FIG. 1 illustrates, by flow diagram, selected steps in an exemplary method 100 performed according to the principles of the present invention. The method comprises, in step 110, positioning a portion of a semiconductor substrate in a field of view of an inspection tool.

The semiconductor substrate, such as a silicon wafer, comprises a plurality of integrated circuit (IC) dies. Each of the IC dies has metal silicide electrodes formed on components of microelectronic devices in the IC. For example, the microelectronic devices can comprise nMOS, pMOS transistors and CMOS devices, having metal silicide electrodes formed on source and drain as well as gate structures.

Those skilled in the art would be familiar the use of an electron-beam source to raster an incident electron-beam over the surface of the semiconductor substrate within a particular field of view that is appropriate for the inspection tool being used. For example an eS20™ inspection tool (KLA-Tencor Inc., San Jose, Calif.) can have a field of view of about 2 by 2 microns. The portion of the semiconductor substrate selected for voltage contrast imaging is equal to or less than the field of view selected for the inspection tool.

The method also comprises producing a voltage contrast image, in step 120, under conditions where the image is obtained using a collection field that is stronger than an incident field. The term incident field as used herein refers to an electrical field associated with a potential developed on the surface of the semiconductor substrate as a result of the impinging rastering incident electron-beam. The term collection field as used herein refers to an electrical field associated with a potential created in a space above the semiconductor substrate to attract and enhance the detection of secondary electrons that are generated. Both the collection field and incident fields have a positive charge. Thus, in the context of the present invention, a collection field that is stronger than the incident field means that the collection field is more positive than the incident field. In certain preferred embodiments, the collection field is at least about 8 percent stronger than the incident field.

The collection field can be adjusted to be stronger than the incident field, in step 125, by adjusting one or both of a landing energy associated with the incident electron beam or a detection potential associated with a collection optical unit of the inspection tool. The quantity of secondary electrons produced at the surface of the semiconductor substrate depends upon the landing energy, that is, the amount of energy in the incident electron-beam at the surface of the semiconductor surface. The amount of secondary electrons detected can be increased by applying a detection potential to a grid or mesh of the collection optical unit. A positive potential applied to the grid or mesh attracts the negatively charged secondary electrons into the collection optical unit.

In certain advantageous embodiments of the method 100, the detection potential used to generate the collection field is greater than the electron-beam landing energy that generates the incident field. The extent to which the detection potential is made greater than the electron-beam landing energy depends upon the composition of the semiconductor substrate and microelectronic device. For example, in some embodiments directed to the detection of nickel silicide defects, the detection potential is at least about 20 electron-Volts greater than the electron-beam landing energy. In other embodiments, where tungsten contacts are formed on nickel silicide electrodes, the detection potential preferably ranges from about 20 electron-Volts to about 400 electron-Volts greater than the electron-beam landing energy voltage. In other embodiments, where copper contacts are formed on nickel silicide electrodes, the detection potential preferably ranges from about 20 electron-Volts to about 800 electron-Volts greater than the electron-beam landing energy voltage.

The method 100 further comprises using, in step 130 the voltage contrast image to determine a metal silicide defect. The inspection tool is configured using conventional procedures to contrast differences in signal intensities received from different areas of the microelectronic device. The tool is typically adjusted to display gray-scale voltage contrast images in which metal contacts appear as an intense white signal while insulating material surrounding the contact appears as a low intensity dark signal. Of course, the tool could be configured to display the signal from the metal contact as a dark spot in a reverse contrast image, or as a particular color in a color image, where colors are coded according to a predefined range of signal intensities. A metal contact that is coupled to a microelectronic device with a metal silicide defect has a higher signal intensity than adjacent metal contacts that are coupled to microelectronic devices with no metal silicide defect.

To determine a metal silicide defect in step 130, the inspection tool is configured to display the voltage contrast image obtained in step 120 to have a signal corresponding to the metal silicide defects that are pipes or nubs. As noted above, typically the voltage contrast image depicts an intense white signal for metal contacts that are coupled to a microelectronic device having metal silicide pipes or nub defects. The ability to detect both metal silicide pipe or nub defects using the method of the present invention is in contrast to conventional methods. Conventional methods of defect detection are capable of displaying signals corresponding to metal silicide defects that are pipes only.

The terms pipes and nubs as used herein refers to the size of the metal silicide defect, and in particular, the length of the long axis of the defect, at the time of defect detection. For the purposes of the present invention, a pipe refers to a cylindrical-shaped metal silicide defect whose long axis is of sufficient length to create a short circuit between one component of a microelectronic device and another component of the same, or a different adjacent, microelectronic device. A nub refers to a similarly shaped metal silicide defect, with the exception that its long axis is not long enough to create a short circuit between one component of a microelectronic device and another component of the same, or a different adjacent microelectronic device.

As noted above, metal silicide defects are thought to form due to the diffusion of metal atoms from metal silicide electrodes into channels in the lattice structure of the semiconductor substrate. The distance that metal atoms diffuse through the channel defines the length of the long axis of the pipe or nub. This diffusion distance depends on numerous factors, including the chemical identity of the metal atom, the size of the channel, and the duration and magnitude of temperature elevations that the semiconductor substrate is subjected to.

Additionally, the characterization of a metal silicide defect as a pipe or nub in step 130 depends upon the technology node of interest. The design rules for a particular technology node will govern the minimum separation distance between individual microelectronic devices and the dimensions and separation between components within a microelectronic device. The smaller the technology node, the shorter the long axis of the pipe has to be to cause a short circuit. One of ordinary skill in the art would understand how to adjust the definition of pipes and nubs for the technology node of interest.

Consider as a non-limiting example, a 65-nanometer technology node, where the design rules specify a gate length of about 65 nanometers and a source drain region length of about 1 to 3 times the gate length. In this situation, a metal silicide pipe defect causing a short circuit between the source drain region and the semiconductor substrate under the gate is estimated to have a long axis of at least about 20 nanometers. In some applications of the method 100, nubs having a long axis as small as about 5 nanometers can be detected.

It is emphasized that the characterization of a metal silicide defect as a pipe or nub refers to the status of the defect at the time the method 100 is performed. Preferably, the method 100 is performed as part of the FEOL process, and even more preferably, after completing all thermal processes in the FEOL process. As noted above, if the microelectronic device is subjected to additional temperature increases during BEOL thermal processes, then the metal atoms can diffuse an additional distance through channels of the substrate, which in turn, can transform a nub into a pipe. The voltage contrast image obtained in step 120 can detect both pipes and nubs in the FEOL process, thereby providing an early warning of metal silicide defects with the potential to cause the microelectronic device to not operation within performance specifications.

In some applications, a decision is made in step 135, to differentiate between pipes and nubs appearing in the voltage contrast image obtained in step 120. In this case, a second voltage contrast image for the same portion of the semiconductor substrate is obtained in step 140 under conditions where a second collection field is weaker than a second incident field. In the context of the present invention, a weaker field means that the second collection field is less positive than the second incident field. Similar to that discussed above, the collection field can be adjusted to be weaker than the incident field, in step 145, by adjusting one or both of the landing energy or a detection potential. In some cases, it is desirable to set the second incident field to be substantially equal to the incident field used to collect the first voltage contrast image, and to adjust the second collection field to be weaker than the incident field.

The inspection tool can be configured to display the second voltage contrast image obtained in step 140 with signals corresponding to metal silicide defects that are pipes. To differentiate pipes and nubs, the second voltage contrast image obtained in step 140 is subtracted from the voltage contrast image obtained in step 120, to provide a voltage contrast difference image in step 150. The inspection tool can then be configured to display signals in the voltage contrast difference image corresponding to metal silicide defects that are nubs.

In some cases it is advantageous to obtain, in step 160, a plurality of voltage contrast images for the same portion of the semiconductor substrate. In such instances, the first and second voltage contrast images obtained in steps 120 and 140, respectively, can each be one of the plurality of images. Preferably, each one of the plurality of voltage contrast images is obtained using one of a set of collection fields that range from less positive to more positive than the impinging field. Of course, the plurality of voltage contrast images can be obtained by adjusting one or both of the impinging and collection fields. The inspection tool can be configured to display the plurality of voltage contrast images with signals corresponding to metal silicide defects. Such a display of the plurality of images is advantageous in situations such as a new fabrication process, where it is uncertain what combination of impinging and collection fields are appropriate to detect metal silicide defects that correspond to pipes and nubs.

In some cases, the inspection tool is also configured, in step 165, to measure a change in intensity of the signals as a function a difference in the field strength (Δ field) between the collection field and the impinging field. In instances where the impinging field is held constant and the collection field is adjusted between scans, it is acceptable to measure the change in intensity of the signals as a function of the changing collection field. In still other instances, it is acceptable to measure the change in intensity of the signals as a function of the changing detection potentials used to generate the collection fields.

The change in intensity of the signal corresponding to the metal silicide defects as function of the Δ field is used to predict a severity of the defect. In some cases, it is sufficient for the severity to simply be a characterisation of the metal silicide defect as a pipe or nub, similar to that obtained by obtaining the difference image in step 150. In other cases, however, the severity is a probability that after further processing, the metal silicide defect corresponding to a nub will form into a defect structure such as a pipe that causes a short circuit or an unacceptable leakage current or other malfunctions in the microelectronic device. As an example, a signal from a metal silicide defect that has a large change in intensity per unit Δ field has a high probability of corresponding to defect that is either already a pipe, or a nub that could easily become a pipe upon further exposure to thermal processes.

If it is determined in step 170 that the entire semiconductor substrate has been inspected, then the method 100 is halted at step 180. Alternatively, if the entire semiconductor substrate has not been inspected, then in step 190, a next portion of the semiconductor substrate is positioned in the field of view of the inspection tool, and steps 120 through 180 are repeated as appropriate on the next portion.

Figure 2:
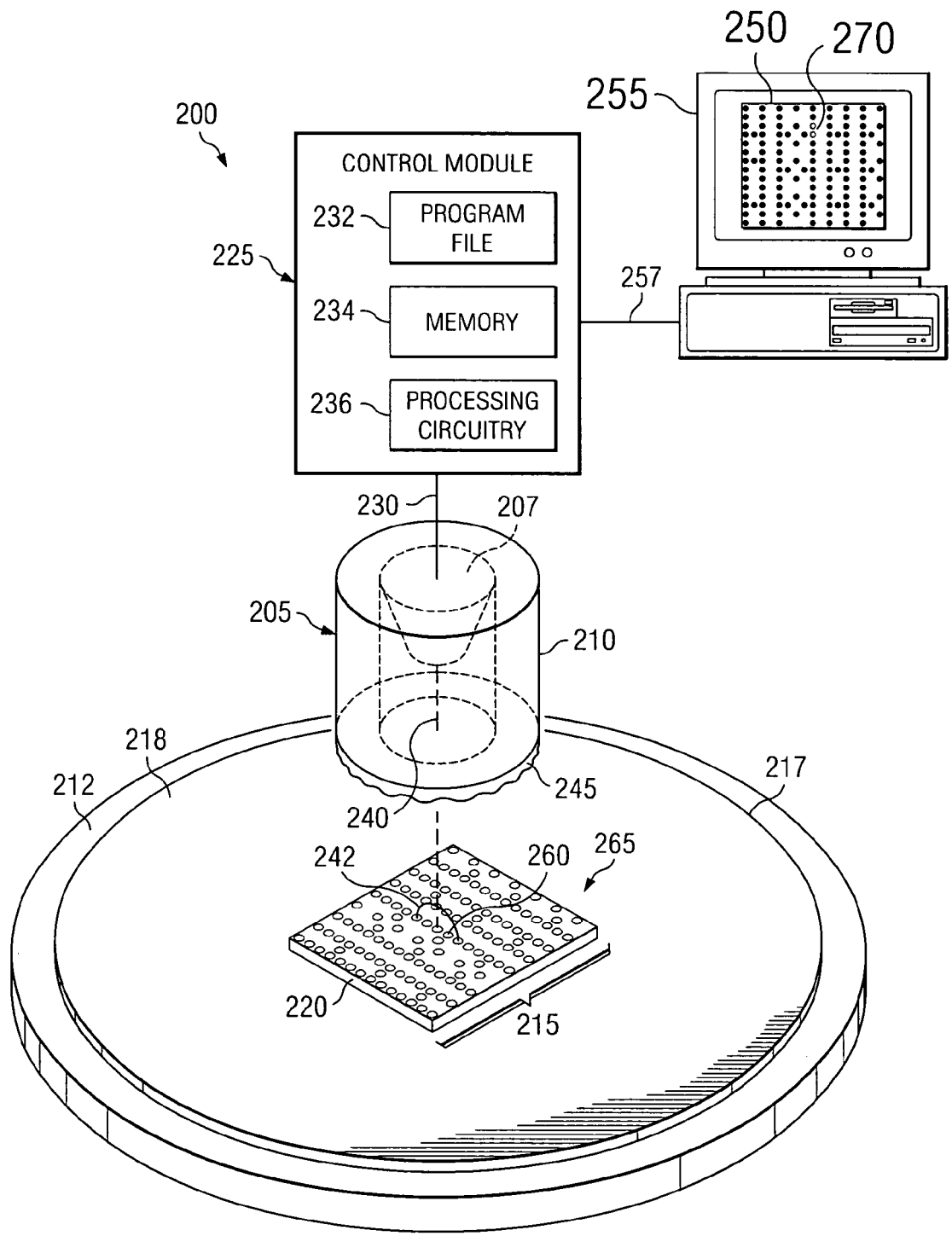
FIG. 2 presents a block diagram of an exemplary inspection system of the present invention for detecting metal silicide defects in a microelectronic device.

Yet another aspect of the present invention is an inspection system for detecting metal silicide defects in a microelectronic device. FIG. 2 presents a block diagram of an exemplary inspection system 200 of the present invention. The inspection system 200 comprises an inspection tool 205. The inspection tool 205 comprises an electron-beam source 207 and a collection optical unit 210. The inspection system 200 also comprises a stage 212 configured to position a portion 215 of a semiconductor substrate 217 having a surface 218 in a field of view 220 of the inspection tool 205. For the embodiment shown in FIG. 2 the portion 215 of the substrate 217 selected for inspection is substantially the same size as the field of view 220.

The inspection system 200 further comprises a control module 225. The control module 225 can comprise any conventional processing device capable of performing operations needed to control the inspection of microelectronic devices, and include components well known to those skilled in the art. Such components can include a bus 230 to send commands to and receive data from the inspection tool 205, a program file 232 to control the inspection tool 205, a memory 234 to hold data obtained by the inspection tool 205, processing circuitry 236 to perform mathematical operations on the data.

The control module 225 is configured to adjust a landing energy of an incident electron-beam 240 applied by the electron-beam source 207 to the semiconductor substrate 217 and thereby produce an incident field 242 on the substrate surface 218. The control module 225 is also configured to adjust a detection potential applied to the collection optical unit 210 to thereby produce a collection field 245 that is stronger than the incident field 242. The control module 225 is further configured to produce a voltage contrast image 250 of the portion 215. As illustrated in FIG. 2, the voltage contrast image 250 can be displayed on a video monitor 255 that is coupled to the control module 225 via a data cable 257.

The control module 225 is also configured to use the voltage contrast image 250 to determine one or more metal silicide defects 260 in a microelectronic device 265. Any of the embodiments of the methods and components discussed above and illustrated in FIG. 1, can be used by the inspection system 200, to determine and characterize the metal silicide defect. Consider the following example of how the control module 225 can be configured to convert a first data set from the collection optical unit 210 into a voltage contrast image 250 of the portion 215 of the substrate 218.

The program file 232 of the control module 230 can configure the inspection tool 205 to produce a collection field 245 that is at least about 8 percent stronger than the incident field 242. A first data set obtained from the inspection tool 205 using these relative field strengths is stored in the memory 234 of the control module 230. The processing circuitry 236 operates on the first data set to convert it into the voltage contrast image 250 of the portion 215. Because the collection field 245 is stronger than the incident field 242, the voltage contrast image 250 has signals 270 corresponding to metal silicide defects 260 that are pipes or nubs.

To further differentiate the metal silicide defects 260, the control module 225 can be further configured to adjust the electron-beam's 235 landing energy to produce a second incident field on the substrate surface 245 and adjust the detection potential to produce a second collection field that is weaker than the second incident field. A second data set obtained from the collection optical unit 210 under these conditions can then be converted into a second voltage contrast image of the same portion 215 of substrate 217. The second voltage contrast image has signals corresponding to metal silicide defects that are pipes only.

The control module 225 is further configured to subtract the second data set from the first data set to produce a third data set. The control module 225 is also configured to convert the third data set into a difference voltage contrast image having signals corresponding to metal silicide defects that are nubs. To minimize the time to collect such data, it is advantageous for the control module 225 to be configured to direct the inspection tool 205 to sequentially collect the first and second data set from the same portion 215 of the substrate 217 before commanding the stage 212 to move a different portion of the substrate 217 into the field of view 220. Of course, the control module 225 can be configured to obtain a plurality of voltage contrast images of the same portion 217 of the substrate 218 in order to further characterize the severity of metal silicide defects.

Figure 3:
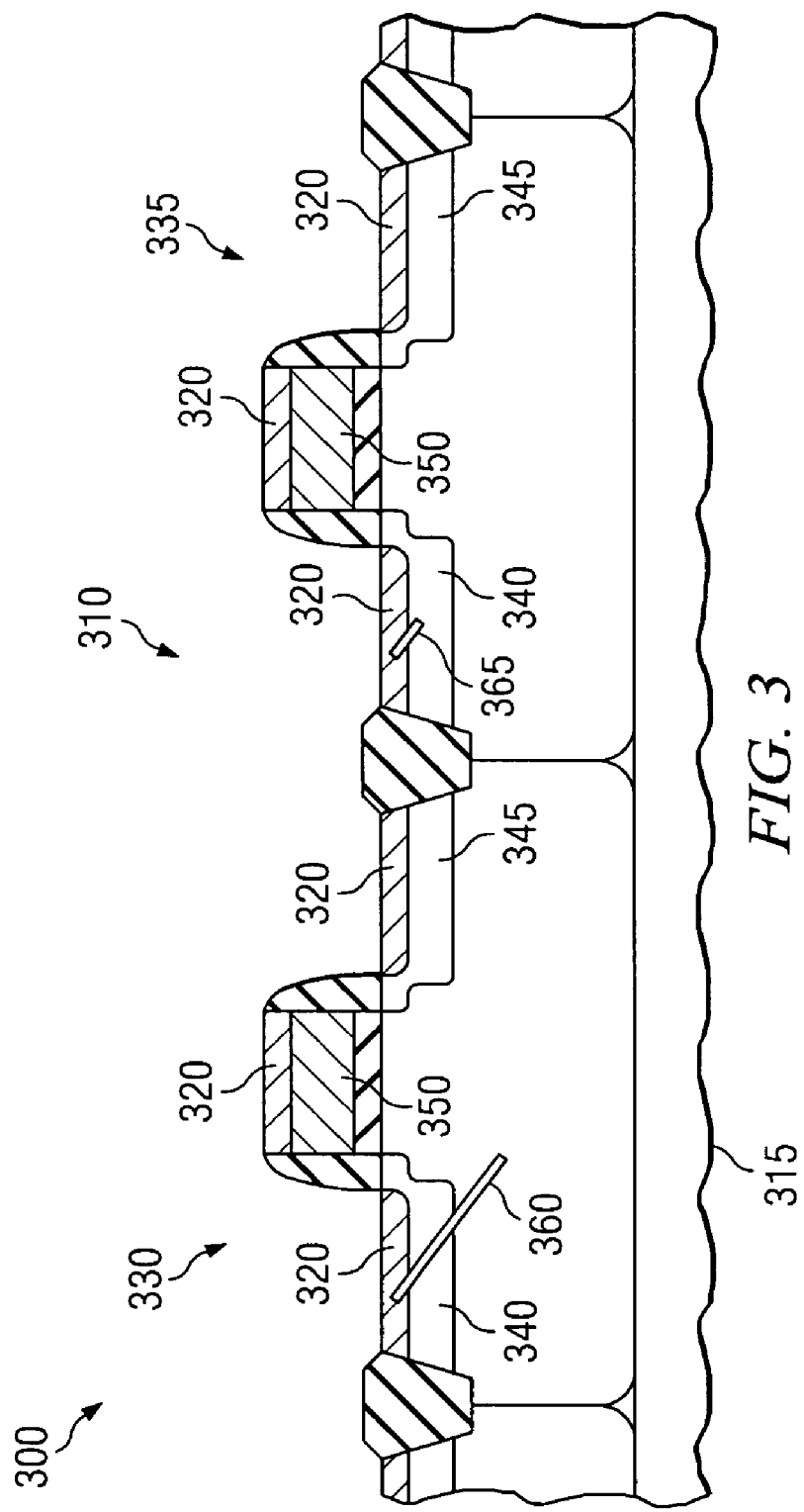
FIGS. 3-5 illustrate cross-sectional views of selected steps in an exemplary method of manufacturing an integrated circuit according to the principles of the present invention.
Figure 4:
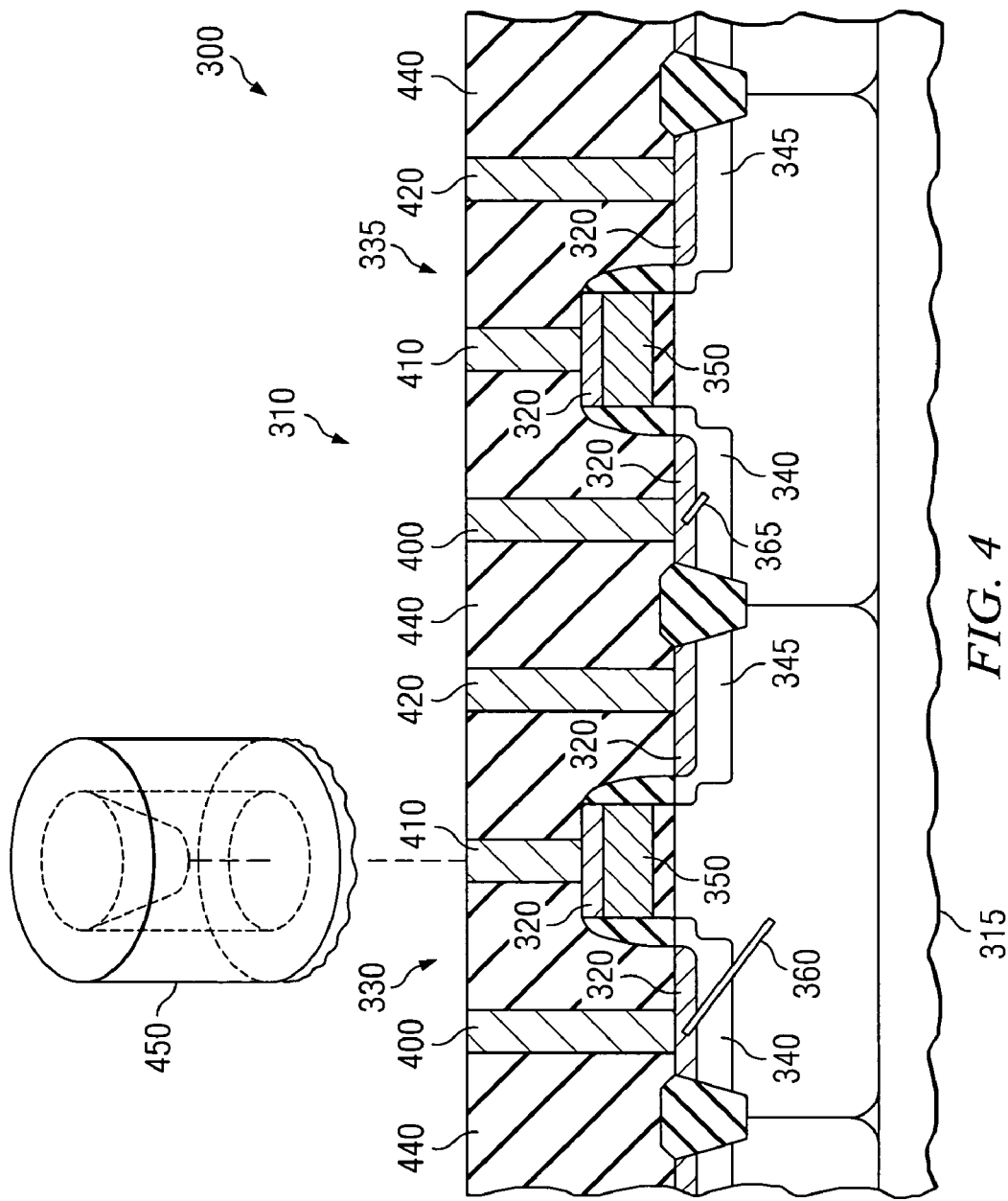
Figure 5:
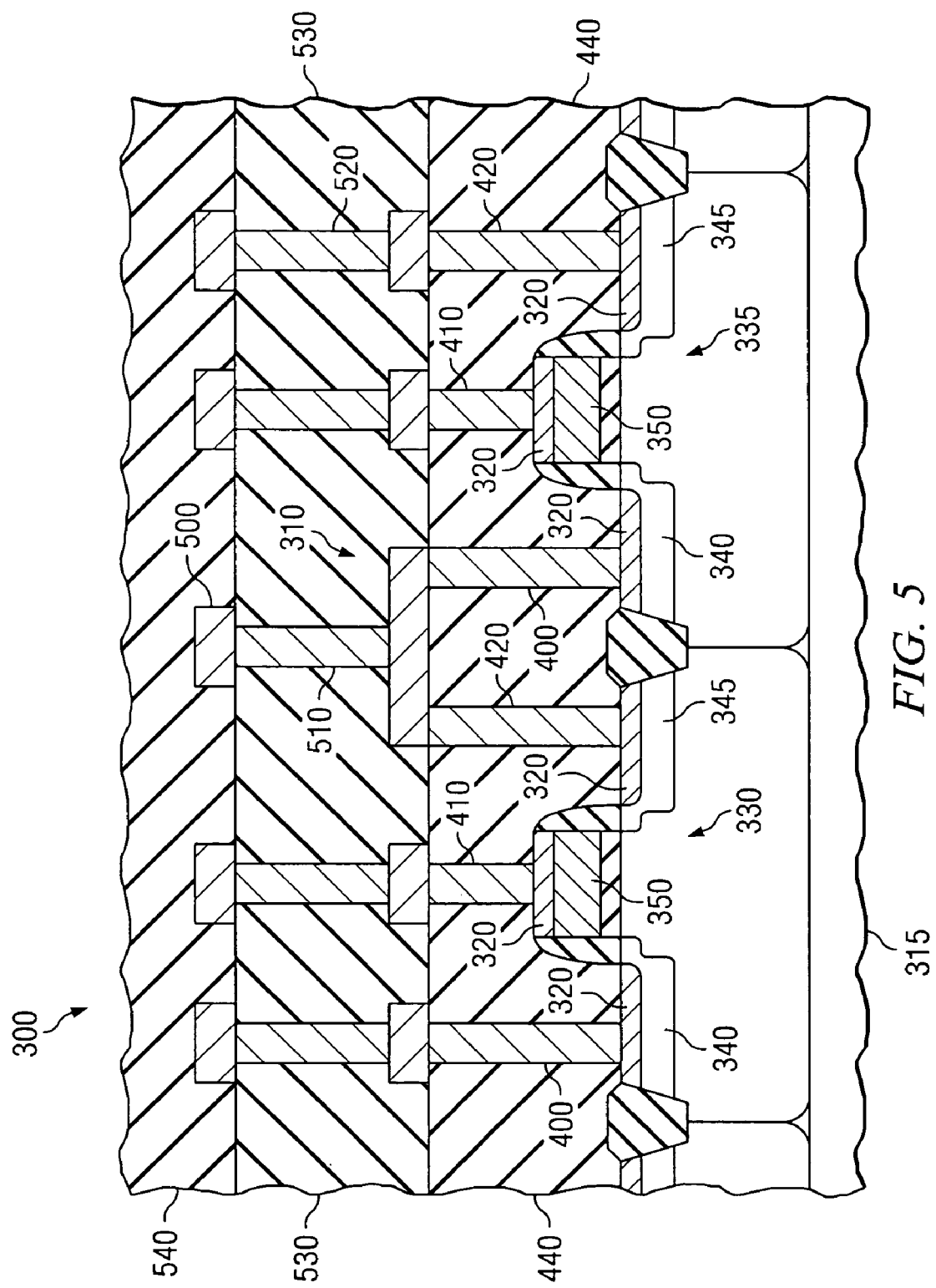

Still another aspect of the present invention is a method of manufacturing an integrated circuit. FIGS. 3-5 illustrate cross-sectional views of selected steps in an exemplary method of manufacturing an integrated circuit 300 according to the principles of the present invention. Turning first to FIG. 3, illustrated is the partially completed integrated circuit 300 after forming a microelectronic device 310 on a semiconductor substrate 315 and forming metal silicide electrodes 320 for the microelectronic device 310. Some preferred embodiments of the microelectronic device 310 comprise an nMOS transistor 330 and a pMOS transistor 335 that form a microelectronic device 310 that is a CMOS device. However, the microelectronic device can also comprise Junction Field Effect transistors, bipolar transistors, biCMOS transistors, or other conventional device components, and combinations thereof.

Any conventional methods and materials can be used to fabricate the microelectronic device 310 and metal silicide electrodes 320. Typically forming the microelectronic device 310 and metal silicide electrodes 320 comprise steps in a FEOL process. Included in the FEOL process are thermal processes to react a transition metal layer deposited on structure of the microelectronic device 310, such as source and drain structures 340, 345 and gate structures 350 to form the metal silicide electrodes 320. These and other thermal processes can also result in the formation of metal silicide defects, which are illustrated in FIG. 3 as pipes 360 and nubs 365.

With continuing reference to FIG. 3, FIG. 4 illustrates the integrated circuit 300 after forming contacts 400, 410, 420, such as tungsten or copper contacts in an insulating layer 440, such as a silicon dioxide layer, located over the semiconductor device 320. One or more of the contacts 400, 410, 420 are connected to the metal silicide electrodes 320. FIG. 4 further illustrates inspecting the microelectronic device 310 for metal silicide defects 360, 365. Any of the above-described methods and systems and their component parts, such as an inspection tool 450, can be used to facilitate the inspection. For instance, the inspection can comprise positioning a portion of the semiconductor substrate 315 in a field of view of the inspection tool 450, producing a voltage contrast image using a collection field that is stronger than an incident field and using the voltage contrast image to determine a presence of a metal silicide defect 360, 365 in the microelectronic device 310.

Preferably, the inspection comprise steps in a FEOL process, because then the FEOL process can be halted if the metal silicide defect 360, 365 is detected, thereby saving manufacturing resources and time. Alternatively, one or more steps in the manufacturing process can be modified if a metal silicide defect 360, 365 is detected. One of ordinary skill in art would be aware of the multitude of modifications that could be made to reduce or eliminate the metal silicide defects. For example, the thermal budget that the microelectronic device is exposed to during one or both of FEOL and BEOL processes can be reduced. As another example, a thinner transition metal layer can be deposited on one or more of the source, drain and gate structures.

If no metal silicide defect is detected, or if the defect is judged to be not severe, then the manufacture of the integrated circuit 300 is completed. FIG. 5 illustrates the integrated circuit after forming one or more interconnect metals lines 500, 510, 520 on one or more insulating layers 530, 540 to interconnect the microelectronic device 310 and thereby to form an operative device. Of course, the characterization of a defect as being not severe based on the above-described inspection will be informed and refined by the experiences gathered while manufacturing a plurality of integrated circuits using the same or similar processes.

Although the present invention has been described in detail, those skilled in the art should understand that they can make various changes, substitutions and alterations herein without departing from the scope of the invention in its broadest form.

What is claimed is:

1. A method of detecting metal silicide defects in a microelectronic device, comprising:
    positioning a portion of a semiconductor substrate of said microelectronic device in a field of view of an inspection tool;
    producing a voltage contrast image of said portion, wherein said voltage contrast image is obtained using a collection field that is stronger than an incident field; and
    using said voltage contrast image to determine a metal silicide defect in said microelectronic device.

2. The method as recited in claim 1, wherein said collection field is at least about 8 percent stronger than said incident field.

3. The method as recited in claim 1, further comprising:
    using a controller to adjust a detection potential;
    generating a collection field using the detection potential to generate said collection field, wherein the detection potential is greater than an electron-beam landing energy voltage that generates said incident field.

4. The method as recited in claim 3, wherein said detection potential is at least about 20 electron-Volts greater than said electron-beam landing energy voltage.

5. The method as recited in claim 1, wherein said inspection tool is configured to display said voltage contrast image with signals corresponding to said metal suicide defects that are pipes or nubs.

6. The method as recited in claim 1, further comprises producing a second voltage contrast image for said portion, wherein said second voltage contrast image is obtained using a second collection field that is weaker than a second incident field.

7. The method as recited in claim 6, wherein said inspection tool is configured to display said second voltage contrast image with signals corresponding to said metal silicide defects that are pipes.

8. The method as recited in claim 6, wherein said second voltage contrast image is subtracted from said voltage contrast image to provide a voltage contrast difference image displaying signals corresponding to metal silicide defects that are nubs.

9. The method as recited in claim 1, wherein said voltage contrast image is one of a plurality of voltage contrast images for said portion, each one of said plurality of voltage contrast images is obtained using one of a set of collection fields ranging from less positive to more positive than said incident field; and
    said inspection tool is configured to display said plurality of voltage contrast images having signals corresponding to metal silicide defects and to measure a change in intensity of said signals as a function of a difference between said collection field and said incident field.

* * * * *